US012628097B2

(12) United States Patent
Camuffo et al.

(10) Patent No.: US 12,628,097 B2
(45) Date of Patent: \*May 12, 2026

(54) SYSTEM AND METHOD FOR PERFORMING FAST TRANSMISSION OUTPUT POWER TRANSITION

(71) Applicant: Apple Inc., Cupertino, CA (US)

(72) Inventors: Andrea Camuffo, Munich (DE); Andreas Langer, Unterschleissheim (DE); Guenther Hackl, Altoetting (DE); Stephan Henzler, Munich (DE)

(73) Assignee: Apple Inc., Cupertino, CA (US)

( * ) Notice: Subject to any disclaimer, the term of this patent is extended or adjusted under 35 U.S.C. 154(b) by 830 days.

This patent is subject to a terminal disclaimer.

(21) Appl. No.: 17/943,400

(22) Filed: Sep. 13, 2022

(65) Prior Publication Data

US 2024/0089876 A1     Mar. 14, 2024

(51) Int. Cl.
| | |
|---|---|
| *H04K 1/02* | (2006.01) |
| *H03G 3/30* | (2006.01) |
| *H04L 25/03* | (2006.01) |
| *H04L 25/49* | (2006.01) |
| *H04W 52/36* | (2009.01) |
| *H04W 52/52* | (2009.01) |

(52) U.S. Cl.
CPC .......... *H04W 52/52* (2013.01); *H03G 3/3042* (2013.01); *H04W 52/36* (2013.01)

(58) Field of Classification Search
CPC .... H04W 52/52; H04W 52/36; H03G 3/3042; H03F 1/3247
USPC ......................... 375/296, 297, 260, 229, 232
See application file for complete search history.

(56) References Cited

U.S. PATENT DOCUMENTS

| | | | |
|---|---|---|---|
| 6,373,902 | B1 | 4/2002 | Park |
| 7,634,240 | B2 | 12/2009 | Mitzlaff |
| 9,020,454 | B2 | 4/2015 | Waheed |
| 9,813,089 | B2 | 11/2017 | Talty |
| 10,276,521 | B2 | 4/2019 | Babcock |
| 11,121,731 | B2 | 9/2021 | Ravi |
| 11,387,852 | B2 | 7/2022 | Banin |
| 2009/0176464 | A1 | 7/2009 | Liang |
| 2019/0334480 | A1 | 10/2019 | Nomiyama |
| 2021/0218374 | A1 | 7/2021 | Poulin |

(Continued)

OTHER PUBLICATIONS

U.S. Appl. No. 17/943,399, filed Sep. 13, 2022.*

*Primary Examiner* — Phuong Phu
(74) *Attorney, Agent, or Firm* — FLETCHER YODER PC

(57)     ABSTRACT

This disclosure is directed to compensating for gain drift due to switching the output power of a transmitter of an electronic device. In some cellular network applications, the transmit power level of a transmitter may be frequently adjusted from a low power level to a high power level. If the power level is not switched to the desired power level within a given interval, the transmission signal may be distorted. To enable the transmitter to reach a desired output power within the interval, the voltage supply of a power amplifier may be raised during a low power symbol, which may produce an undesirable gain increase. To mitigate or eliminate the low power symbol gain increase, a gain compensation signal may be introduced into the transmitter. The compensation signal may be adjusted and refined by implementing a power control loop, the power control loop may include a signal generator.

20 Claims, 11 Drawing Sheets

1000

(56)  References Cited

U.S. PATENT DOCUMENTS

| 2021/0320825 | A1 | 10/2021 | Banuli Nanje Gowda |
| 2022/0123744 | A1 | 4/2022 | Khlat |
| 2022/0321074 | A1 | 10/2022 | Lehtola |
| 2023/0085587 | A1 | 3/2023 | Shute |
| 2023/0396219 | A1* | 12/2023 | Stulemeijer .......... H03F 1/3247 |
| 2024/0089876 | A1 | 3/2024 | Camuffo |

* cited by examiner

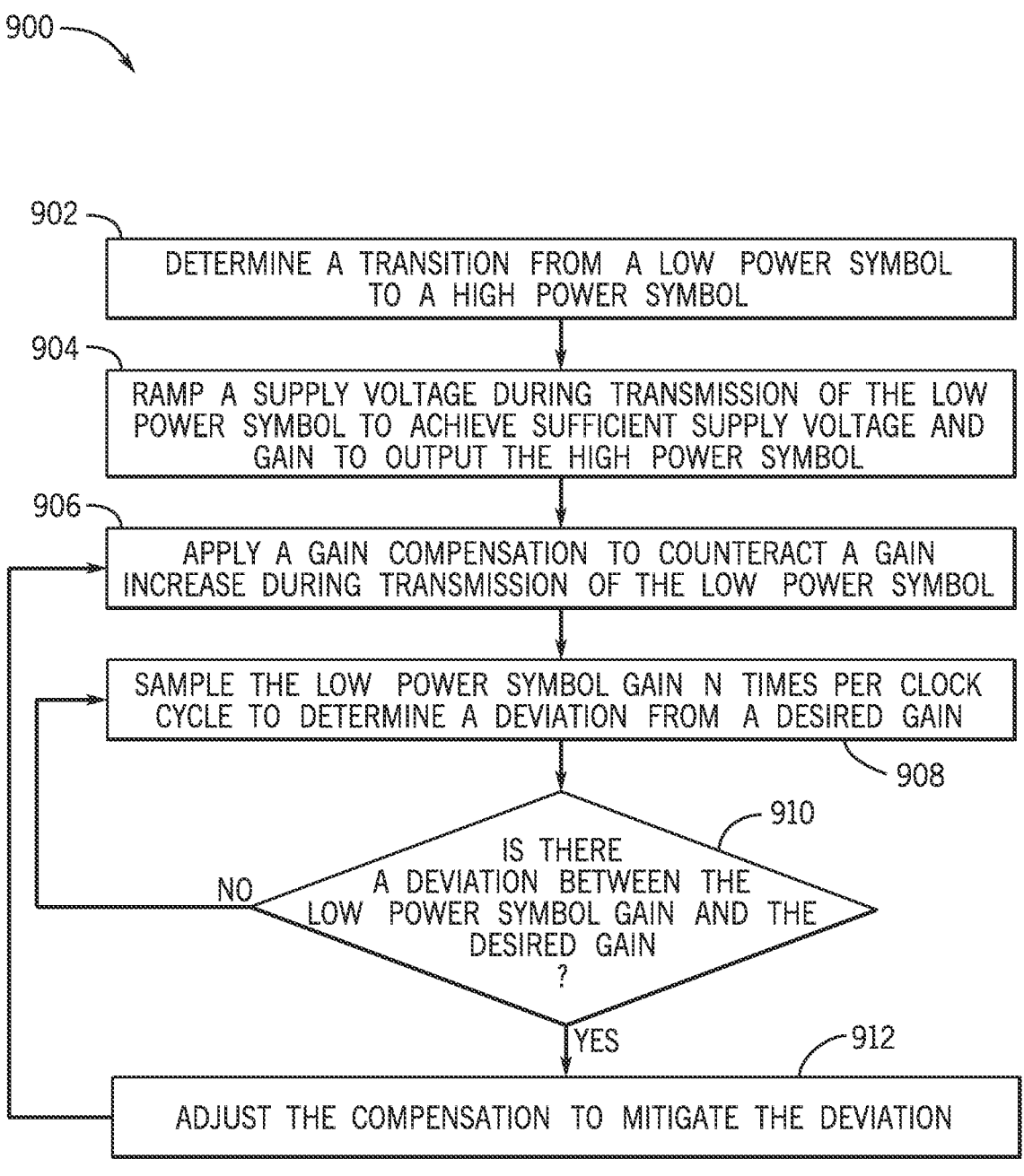

900

902
DETERMINE A TRANSITION FROM A LOW POWER SYMBOL TO A HIGH POWER SYMBOL

904
RAMP A SUPPLY VOLTAGE DURING TRANSMISSION OF THE LOW POWER SYMBOL TO ACHIEVE SUFFICIENT SUPPLY VOLTAGE AND GAIN TO OUTPUT THE HIGH POWER SYMBOL

906
APPLY A GAIN COMPENSATION TO COUNTERACT A GAIN INCREASE DURING TRANSMISSION OF THE LOW POWER SYMBOL

SAMPLE THE LOW POWER SYMBOL GAIN N TIMES PER CLOCK CYCLE TO DETERMINE A DEVIATION FROM A DESIRED GAIN
908

910
IS THERE A DEVIATION BETWEEN THE LOW POWER SYMBOL GAIN AND THE DESIRED GAIN ?
NO
YES

912
ADJUST THE COMPENSATION TO MITIGATE THE DEVIATION

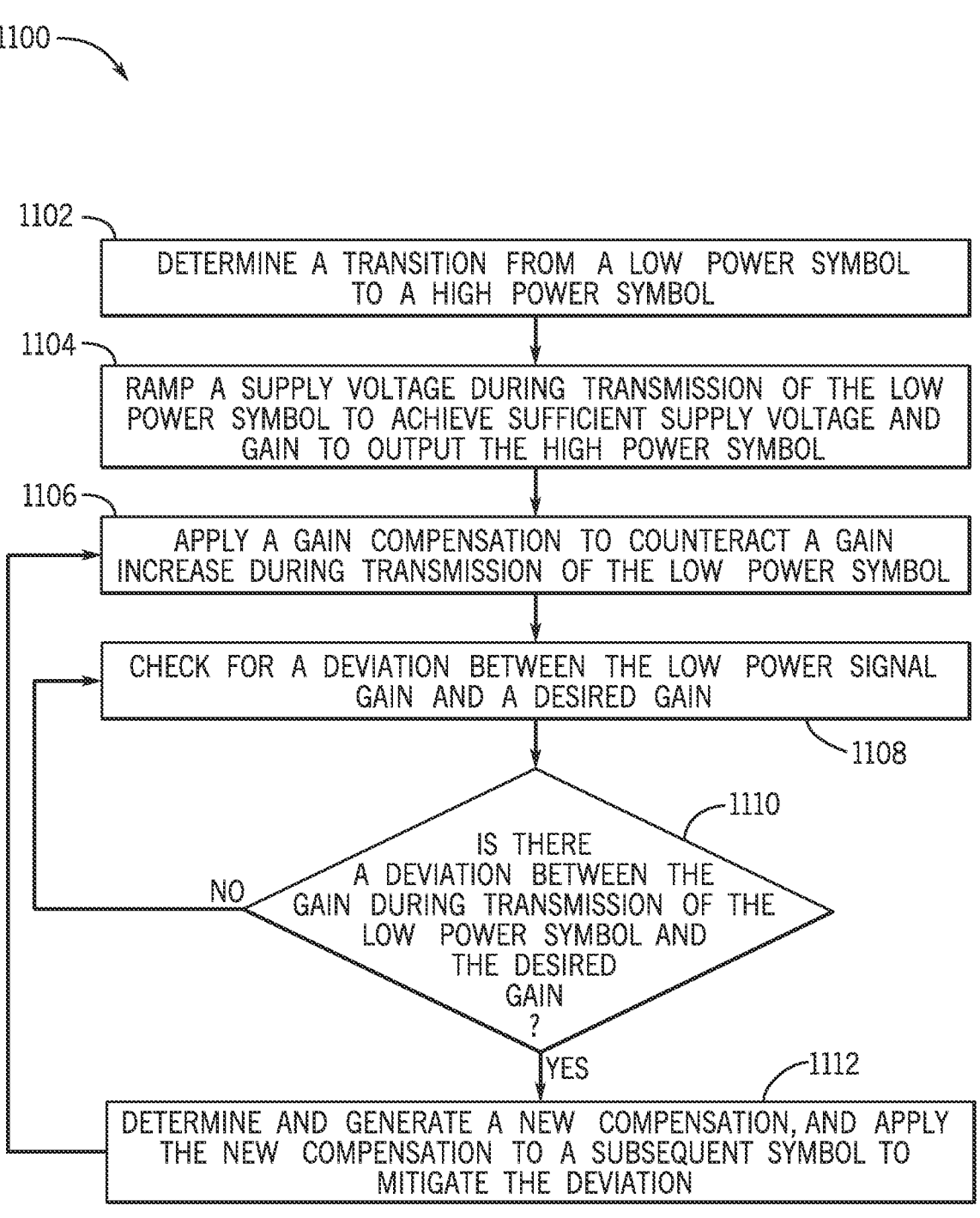

1102

DETERMINE A TRANSITION FROM A LOW POWER SYMBOL TO A HIGH POWER SYMBOL

1104

RAMP A SUPPLY VOLTAGE DURING TRANSMISSION OF THE LOW POWER SYMBOL TO ACHIEVE SUFFICIENT SUPPLY VOLTAGE AND GAIN TO OUTPUT THE HIGH POWER SYMBOL

1106

APPLY A GAIN COMPENSATION TO COUNTERACT A GAIN INCREASE DURING TRANSMISSION OF THE LOW POWER SYMBOL

CHECK FOR A DEVIATION BETWEEN THE LOW POWER SIGNAL GAIN AND A DESIRED GAIN

1108

1110

IS THERE A DEVIATION BETWEEN THE GAIN DURING TRANSMISSION OF THE LOW POWER SYMBOL AND THE DESIRED GAIN ?

NO

YES

1112

DETERMINE AND GENERATE A NEW COMPENSATION, AND APPLY THE NEW COMPENSATION TO A SUBSEQUENT SYMBOL TO MITIGATE THE DEVIATION

FIG. 11

SYSTEM AND METHOD FOR PERFORMING FAST TRANSMISSION OUTPUT POWER TRANSITION

BACKGROUND

The present disclosure relates generally to wireless communication, and more specifically to regulating transmitter output power.

In an electronic device, a transmitter may be coupled to one or more antennas to enable the electronic device to both transmit wireless signals. In some communication applications, the transmit power level of the transmitter may be adjusted (e.g., switched from a low power mode to a high power mode or vice versa) repeatedly over a short time period (e.g., with each subsequent transmitted symbol) to output a transmission signal at a desired power. However, if the power level is not switched to a desired power level within an interval between a symbol and the subsequent symbol, the transmission signal may be distorted.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, a transmitter includes a mixer that may output a compensated signal based on an input signal and a first compensation signal; a power amplifier electrically coupled to the mixer, where the power amplifier may amplify the compensated signal to generate an amplified signal; and a signal generator electrically coupled to the power amplifier on a feedback path of the transmitter, where the signal generator may output a second compensation signal based on a deviation in gain of the compensated signal.

In another embodiment, a method may include increasing a supply voltage of a power amplifier during transmission of a low power symbol of a transmit signal that is to transition to a high power symbol; applying a first gain compensation signal to the low power symbol of the transmit signal to reduce a gain associated with the low power symbol to generate a compensated transmit signal; generating a second gain compensation signal based on a deviation of the gain; and applying the second gain compensation signal to a subsequent symbol of the transmit signal.

In yet another embodiment, a tangible, non-transitory, computer-readable medium may include machine-readable instruction, wherein the instruction may cause one or more processors of an electronic device to increase a supply voltage of a power amplifier during transmission of a low power symbol of a transmit signal that is to transition to a high power symbol; apply a first gain compensation signal reduce a gain associated with the low power symbol to generate a compensated signal; generate a second gain compensation signal based on a deviation of the gain; and apply the second gain compensation signal to the transmit signal during transmission of a subsequent low power symbol.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings described below in which like numerals refer to like parts.

FIG. 9 is a flowchart of a method by which the power controller of FIG. 8 may adjust a gain compensation to reduce residual gain drift in the transmit chain of FIG. 8, according to embodiments of the disclosure;

FIG. 11 is a flowchart of a method by which the signal generator of FIG. 10 may generate a gain compensation signal to reduce residual gain drift in the transmit chain of FIG. 10, according to embodiments of the disclosure;

DETAILED DESCRIPTION OF SPECIFIC EMBODIMENTS

Figure 1:
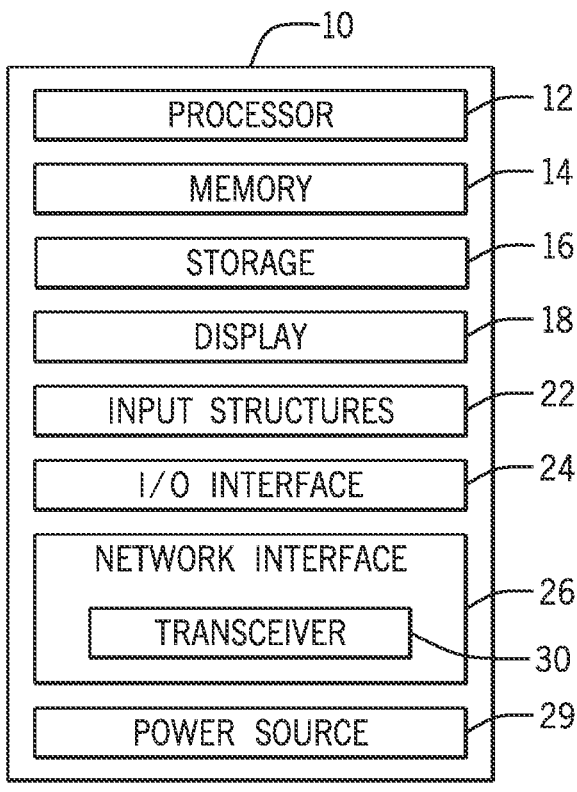
FIG. 1 is a block diagram of an electronic device, according to embodiments of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the particular features, structures, or characteristics may be combined in any suitable manner in one or more embodiments. Use of the terms "approximately," "near," "about," "close to," and/or "substantially" should be understood to mean including close to a target (e.g., design, value, amount), such as within a margin of any suitable or contemplatable error (e.g., within 0.1% of a target, within 1% of a target, within 5% of a target, within 10% of a target, within 25% of a target, and so on). Moreover, it should be understood that any exact values, numbers, measurements, and so on, provided herein, are contemplated to include approximations (e.g., within a margin of suitable or contemplatable error) of the exact values, numbers, measurements, and so on.

This disclosure is directed to transitioning between output power levels of a transmitter of an electronic device. In certain cellular network applications (e.g., 5G applications) the transmit power level at an antenna of an electronic device may be adjusted (e.g., switched from a low power mode to a high power mode or vice versa) repeatedly over a short time period (e.g., with each new symbol being transmitted). In some cases, it may be desirable to ensure that the power level change is contained within a time period corresponding to a cyclic prefix of a symbol (e.g., a time period between a first symbol and a next symbol). In some instances, the switching time of the cyclic prefix may be as short as 1.1 microseconds s).

When switching from a higher power level to a lower power level, a voltage supply of a power amplifier may be stepped down in small increments over consecutive symbols, which may prevent issues associated with a slow decay of the voltage. This stepping down may have an insubstantial or minimal impact on power consumption. However, when switching from a lower power level to a higher power level, it may be desirable for a supply voltage of a power amplifier to complete a voltage rise or transition within the switching time to prevent the transmitter from emitting an output wave with excess distortion. In some cases, the supply voltage may be supplied by a direct current-to-direct current (DC-DC) converter, which may operate in envelope tracking (ET) mode or in average power tracking (APT) mode. While ET mode may support power changes fast enough to contain transients within the switching time, it may be less desirable for large transmission signal bandwidths (e.g., ET may support 100 megahertz (MHz) bandwidth or less). For larger transmission signal bandwidths (e.g., 200 MHz bandwidths or greater), APT mode may be employed. However, DC-DC converters operating in APT mode may be too slow to switch the transmit power level within the time allotted for the cyclic prefix.

To achieve transmit power level switching within the switching time, the DC-DC voltage rise may be anticipated and increased gradually so that by the time the antenna power is switched (e.g., by the end of a cyclic prefix and the start of a subsequent symbol) the power amplifier has adequate supply voltage to generate sufficient transmit power. However, gradually increasing the DC-DC voltage may cause a gain increase and result in increasing power during a low-power symbol N to achieve sufficiently high voltage in a high power symbol N+1, causing an undesirable gain increase in the low power symbol N. Moreover, a phase relationship between the power amplifier's input and output may be negatively impacted (e.g., negatively affecting linearity of the power amplifier).

To achieve sufficient voltage increase in a timely manner without negatively impacting a previous symbol, a compensation ramp may be applied to a transmission output signal. Applying a compensation ramp to the signal may compensate for the gain drift at the low power symbol. The compensation ramp may be determined based on a compensation profile of the gain drift (e.g., due to a voltage increase ramp of the DC-DC converter). In an embodiment, the compensation profile may be calibrated or characterized based on a shape and amplitude of the voltage increase ramp determined during manufacture and stored in memory of the electronic device.

However, in some cases, there may be deviations (e.g., due to temperature, age of the electronic device, loading condition, and so on) between the stored compensation profile and a current behavior of the power amplifier, such that the impact on the signal may be insufficiently mitigated. In some embodiments, one or more power control loops may be leveraged to dynamically adjust the compensation ramp to enhance or optimize the signal compensation (e.g., by reducing or eliminating the gain drift). In an embodiment, the one or more power control loops may employ autonomous power controller (APC) assisted compensation. The APC may sample the compensation ramp every N number of clock cycles (e.g., every clock cycle, every two clock cycles, and so on) per symbol to determine any deviation from a desired gain. If a deviation is determined, the APC may adjust the compensation ramp on a subsequent clock cycle to reduce or eliminate the deviation.

In another embodiment, a signal generator may be used to implement the compensation ramp. The signal generator may generate a compensation signal to mitigate an anticipated gain drift at the low power signal. The compensation signal may be probed at one or more points in time to determine whether there is deviation from the desired gain. If deviation from the desired gain is determined to be above a certain threshold, the signal generator may adjust the compensation signal at the subsequent symbol. In this way, the voltage supply of the power amplifier may be sufficiently raised while eliminating or reducing gain drift in adjacent symbols.

With the foregoing in mind, FIG. 1 is a block diagram of an electronic device 10, according to embodiments of the present disclosure. The electronic device 10 may include, among other things, one or more processors 12 (collectively referred to herein as a single processor for convenience, which may be implemented in any suitable form of processing circuitry), memory 14, nonvolatile storage 16, a display 18, input structures 22, an input/output (I/O) interface 24, a network interface 26, and a power source 29. The various functional blocks shown in FIG. 1 may include hardware elements (including circuitry), software elements (including machine-executable instructions) or a combination of both hardware and software elements (which may be referred to as logic). The processor 12, memory 14, the nonvolatile storage 16, the display 18, the input structures 22, the input/output (I/O) interface 24, the network interface 26, and/or the power source 29 may each be communicatively coupled directly or indirectly (e.g., through or via another component, a communication bus, a network) to one another to transmit and/or receive data between one another. It should be noted that FIG. 1 is merely one example of a particular implementation and is intended to illustrate the types of components that may be present in the electronic device 10.

By way of example, the electronic device 10 may include any suitable computing device, including a desktop or notebook computer (e.g., in the form of a MacBook®, MacBook® Pro, MacBook Air®, iMac®, Mac® mini, or Mac Pro® available from Apple Inc. of Cupertino, California), a portable electronic or handheld electronic device such as a wireless electronic device or smartphone (e.g., in the form of a model of an iPhone® available from Apple Inc. of Cupertino, California), a tablet (e.g., in the form of a model of an iPad® available from Apple Inc. of Cupertino, California), a wearable electronic device (e.g., in the form of an Apple Watch® by Apple Inc. of Cupertino, California), and other similar devices. It should be noted that the processor 12 and other related items in FIG. 1 may be embodied wholly or in part as software, hardware, or both. Furthermore, the processor 12 and other related items in FIG. 1 may be a single contained processing module or may be incorporated wholly or partially within any of the other elements within the electronic device 10. The processor 12 may be implemented with any combination of general-purpose microprocessors, microcontrollers, digital signal processors (DSPs), field programmable gate array (FPGAs), programmable logic devices (PLDs), controllers, state machines, gated logic, discrete hardware components, dedicated hardware finite state machines, or any other suitable entities that may perform calculations or other manipulations of information. The processors 12 may include one or more application processors, one or more baseband processors, or both, and perform the various functions described herein.

In the electronic device 10 of FIG. 1, the processor 12 may be operably coupled with a memory 14 and a nonvolatile storage 16 to perform various algorithms. Such programs or instructions executed by the processor 12 may be stored in any suitable article of manufacture that includes one or more tangible, computer-readable media. The tangible, computer-readable media may include the memory 14 and/or the nonvolatile storage 16, individually or collectively, to store the instructions or routines. The memory 14 and the nonvolatile storage 16 may include any suitable articles of manufacture for storing data and executable instructions, such as random-access memory, read-only memory, rewritable flash memory, hard drives, and optical discs. In addition, programs (e.g., an operating system) encoded on such a computer program product may also include instructions that may be executed by the processor 12 to enable the electronic device 10 to provide various functionalities.

In certain embodiments, the display 18 may facilitate users to view images generated on the electronic device 10. In some embodiments, the display 18 may include a touch screen, which may facilitate user interaction with a user interface of the electronic device 10. Furthermore, it should be appreciated that, in some embodiments, the display 18 may include one or more liquid crystal displays (LCDs), light-emitting diode (LED) displays, organic light-emitting diode (OLED) displays, active-matrix organic light-emitting diode (AMOLED) displays, or some combination of these and/or other display technologies.

The input structures 22 of the electronic device 10 may enable a user to interact with the electronic device 10 (e.g., pressing a button to increase or decrease a volume level). The I/O interface 24 may enable electronic device 10 to interface with various other electronic devices, as may the network interface 26. In some embodiments, the I/O interface 24 may include an I/O port for a hardwired connection for charging and/or content manipulation using a standard connector and protocol, such as the Lightning connector provided by Apple Inc. of Cupertino, California, a universal serial bus (USB), or other similar connector and protocol. The network interface 26 may include, for example, one or more interfaces for a personal area network (PAN), such as an ultra-wideband (UWB) or a BLUETOOTH® network, a local area network (LAN) or wireless local area network (WLAN), such as a network employing one of the IEEE 802.11x family of protocols (e.g., WI-FI®), and/or a wide area network (WAN), such as any standards related to the Third Generation Partnership Project (3GPP), including, for example, a $3^{rd}$ generation (3G) cellular network, universal mobile telecommunication system (UMTS), $4^{th}$ generation (4G) cellular network, long term evolution (LTE®) cellular network, long term evolution license assisted access (LTE-LAA) cellular network, $5^{th}$ generation (5G) cellular network, and/or New Radio (NR) cellular network, a $6^{th}$ generation (6G) or greater than 6G cellular network, a satellite network, a non-terrestrial network, and so on. In particular, the network interface 26 may include, for example, one or more interfaces for using a cellular communication standard of the 5G specifications that include the millimeter wave (mm-Wave) frequency range (e.g., 24.25-300 gigahertz (GHz)) that defines and/or enables frequency ranges used for wireless communication. The network interface 26 of the electronic device 10 may allow communication over the aforementioned networks (e.g., 5G, Wi-Fi, LTE-LAA, and so forth).

The network interface 26 may also include one or more interfaces for, for example, broadband fixed wireless access networks (e.g., WIMAX®), mobile broadband Wireless networks (mobile WIMAX®), asynchronous digital subscriber lines (e.g., ADSL, VDSL), digital video broadcasting-terrestrial (DVB-T®) network and its extension DVB Handheld (DVB-H®) network, ultra-wideband (UWB) network, alternating current (AC) power lines, and so forth.

As illustrated, the network interface 26 may include a transceiver 30. In some embodiments, all or portions of the transceiver 30 may be disposed within the processor 12. The transceiver 30 may support transmission and receipt of various wireless signals via one or more antennas, and thus may include a transmitter and a receiver. The power source 29 of the electronic device 10 may include any suitable source of power, such as a rechargeable lithium polymer (Li-poly) battery and/or an alternating current (AC) power converter.

Figure 2:
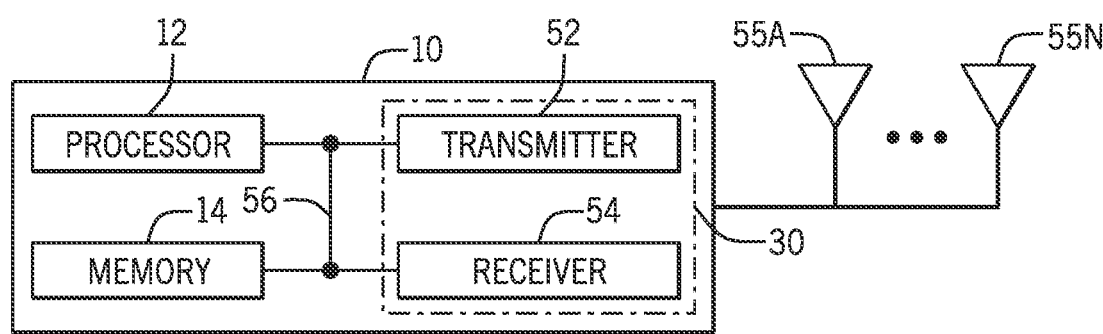
FIG. 2 is a functional diagram of the electronic device of FIG. 1, according to embodiments of the present disclosure.

FIG. 2 is a functional diagram of the electronic device 10 of FIG. 1, according to embodiments of the present disclosure. As illustrated, the processor 12, the memory 14, the transceiver 30, a transmitter 52, a receiver 54, and/or antennas 55 (illustrated as 55A-55N, collectively referred to as an antenna 55) may be communicatively coupled directly or indirectly (e.g., through or via another component, a communication bus, a network) to one another to transmit and/or receive data between one another.

The electronic device 10 may include the transmitter 52 and/or the receiver 54 that respectively enable transmission and reception of data between the electronic device 10 and an external device via, for example, a network (e.g., including base stations or access points) or a direct connection. As illustrated, the transmitter 52 and the receiver 54 may be combined into the transceiver 30. The electronic device 10 may also have one or more antennas 55A-55N electrically coupled to the transceiver 30. The antennas 55A-55N may be configured in an omnidirectional or directional configuration, in a single-beam, dual-beam, or multi-beam arrangement, and so on. Each antenna 55 may be associated with a one or more beams and various configurations. In some embodiments, multiple antennas of the antennas 55A-55N of an antenna group or module may be communicatively coupled a respective transceiver 30 and each emit radio frequency signals that may constructively and/or destructively combine to form a beam. The electronic device 10 may include multiple transmitters, multiple receivers, multiple transceivers, and/or multiple antennas as suitable for various communication standards. In some embodiments, the transmitter 52 and the receiver 54 may transmit and receive information via other wired or wireline systems or means.

As illustrated, the various components of the electronic device 10 may be coupled together by a bus system 56. The bus system 56 may include a data bus, for example, as well as a power bus, a control signal bus, and a status signal bus, in addition to the data bus. The components of the electronic device 10 may be coupled together or accept or provide inputs to each other using some other mechanism.

Figure 3:
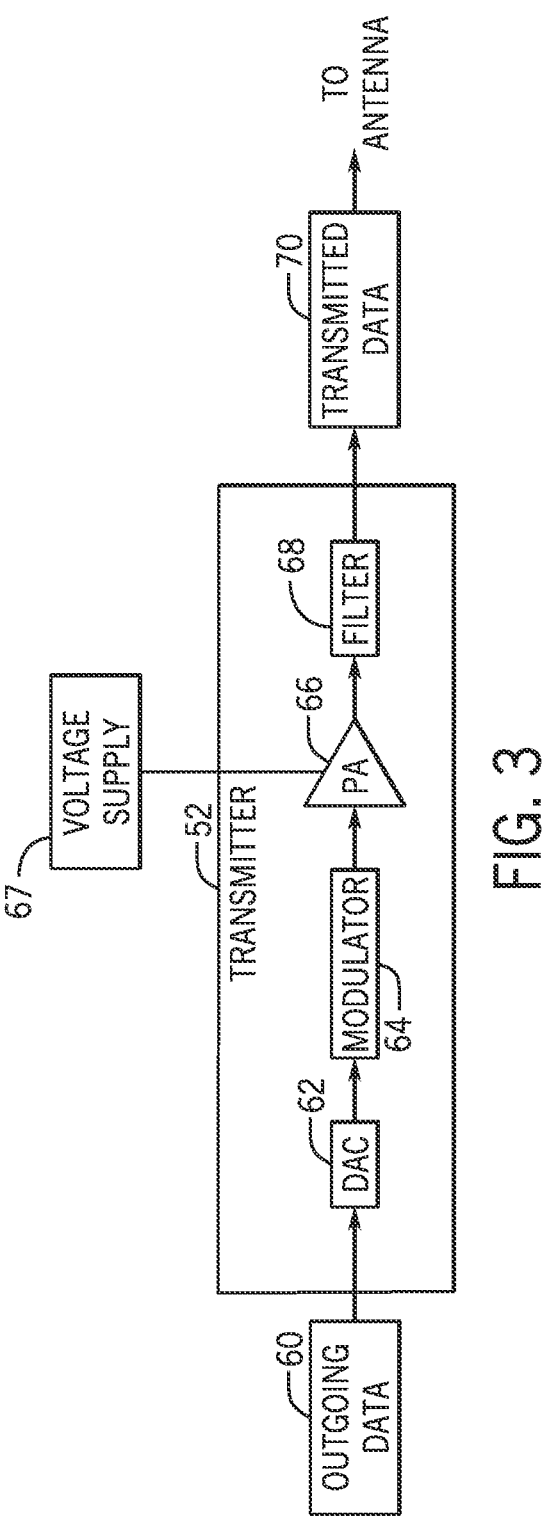
FIG. 3 is a schematic diagram of a transmitter of the electronic device of FIG. 1, according to embodiments of the present disclosure.

FIG. 3 is a schematic diagram of the transmitter 52 (e.g., transmit circuitry), according to embodiments of the present disclosure. As illustrated, the transmitter 52 may receive outgoing data 60 in the form of a digital signal to be transmitted via the one or more antennas 55. A digital-to-analog converter (DAC) 62 of the transmitter 52 may convert the digital signal to an analog signal, and a modulator 64 may combine the converted analog signal with a carrier signal to generate a radio wave. A power amplifier (PA) 66 receives the modulated signal from the modulator 64. The power amplifier 66 may amplify the modulated signal to a suitable level to drive transmission of the signal via the one or more antennas 55. A filter 68 (e.g., filter circuitry and/or software) of the transmitter 52 may then remove undesirable noise from the amplified signal to generate transmitted data 70 to be transmitted via the one or more antennas 55. The filter 68 may include any suitable filter or filters to remove the undesirable noise from the amplified signal, such as a bandpass filter, a bandstop filter, a low pass filter, a high pass filter, and/or a decimation filter. The power amplifier 66 may be coupled to a voltage supply 67, such as a direct current-to-direct current (DC-DC) converter. A DC-DC converter may operate in envelope tracking (ET) mode or in average power tracking (APT) mode. Operating in ET mode may provide relatively fast power level switching, but may be less desirable for large transmission signal bandwidths (e.g., 100 megahertz (MHz) bandwidth or less). APT mode may support larger transmission signal bandwidths (e.g., 200 MHz bandwidths or greater), but may provide relatively slow power level switching.

The power amplifier 66 and/or the filter 68 may be referred to as part of a radio frequency front end (RFFE), and more specifically, a transmit front end (TXFE) of the electronic device 10. Additionally, the transmitter 52 may include any suitable additional components not shown, or may not include certain of the illustrated components, such that the transmitter 52 may transmit the outgoing data 60 via the one or more antennas 55. For example, the transmitter 52 may include a mixer and/or a digital up converter. As another example, the transmitter 52 may not include the filter 68 if the power amplifier 66 outputs the amplified signal in or approximately in a desired frequency range (such that filtering of the amplified signal may be unnecessary).

As previously mentioned, when switching from a higher power level to a lower power level, the voltage supply 67 may be stepped down in small increments over consecutive symbols, which may prevent issues associated with a slow decay of the voltage. This voltage stepdown may have an insubstantial impact on power consumption. However, to achieve low-to-high transmit power level switching within a desired window of time, the voltage rise of the voltage supply 67 may be anticipated and increased gradually so that by the time the power level is switched (e.g., by the end of a cyclic prefix and the start of a subsequent symbol), the gain of power amplifier 66 is sufficient to drive the high power symbol.

Figure 4:
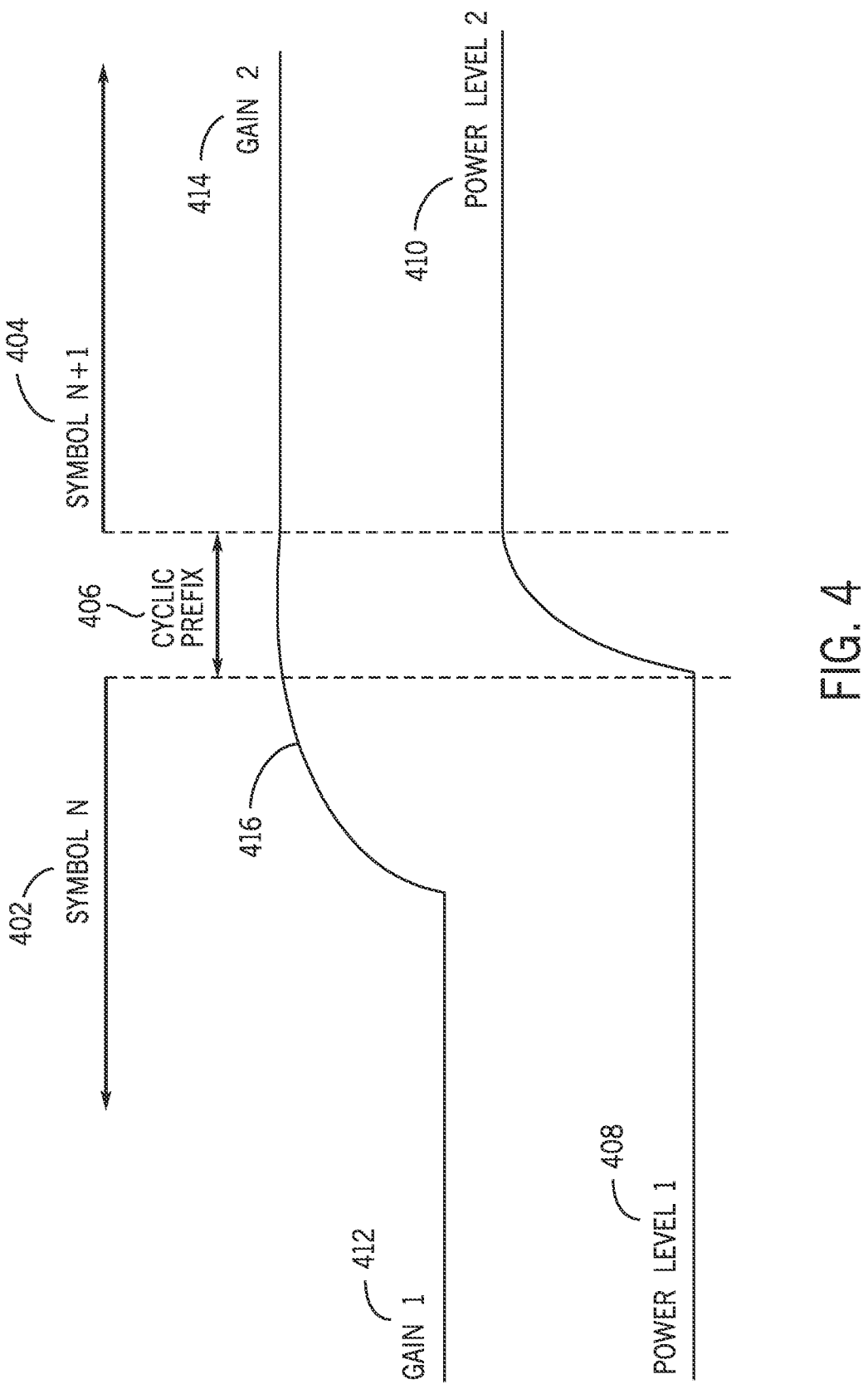
FIG. 4 is a timing diagram illustrating a gain increase of the power amplifier and a power level profile associated with a transmitted signal.

FIG. 4 is a diagram illustrating a gain increase of the power amplifier 66 and a power level profile associated with a transmitted signal with respect to time. To reduce the likelihood of distortion of an output signal, it may be desirable to match the gain of the power amplifier 66 to the power level associated with a symbol (e.g., an orthogonal frequency division multiplexing (OFDM) symbol) being outputted. The symbol may include a complex number representing amplitude and/or phase of one or more bits of the transmitted signal according to the OFDM modulation scheme. For example, the low power symbol 402 (e.g., symbol N) may be transmitted with low or minimized distortion when transmitted at a low power level 408 (e.g., power level 1), and the high power symbol 404 (e.g., symbol N+1) may be transmitted with low or minimized distortion when transmitted at a high power level 410 (e.g., power level 2). The low power level 408 may include a power level that is lower than the high power level 410. Between the low power symbol 402 and the high power symbol 404, there may be a cyclic prefix 406. The cyclic prefix 406 may provide a guard interval, during which the power amplifier 66 may change its gain, such as by increasing its gain from a low gain 412 (e.g., gain 1) to a high gain 414 (e.g., gain 2) as illustrated. If the power amplifier 66 switches from the low gain 412 to the high gain 414 within the guard interval of the cyclic prefix 406, the distortion on the low power symbol 402 and the high power symbol 404 may be reduced or minimized.

As previously stated, the power amplifier 66 may be coupled to a voltage supply 67, such as a direct current-to-direct current (DC-DC) converter. A DC-DC converter may operate in envelope tracking (ET) mode or in average power tracking (APT) mode. Operating in ET mode may provide relatively fast power level switching, which may enable the power amplifier 66 to switch from the low gain 412 to the high gain 414 during the cyclic prefix 406. However, ET mode may be less desirable for large transmission signal bandwidths, such as the bandwidths used in 5G NR communications. APT mode may support larger transmission signal bandwidths, but may provide relatively slow power level switching, such that the power amplifier 66 may be unable to transition from the low gain 412 to the high gain 414 within the bounds of the guard interval of the cyclic prefix 406. To enable the power amplifier 66 to reach the high gain 414 before the end of the cyclic prefix 406 and the beginning of the high power symbol 404, the voltage supply 67 may begin to ramp up (e.g., increase) the supply voltage during the low power symbol 402 (e.g., during a period of when the transmitter 52 is transmitting the low power symbol 402). However, doing so may cause an undesirable gain increase (e.g., referred to herein as gain drift 416) on the low power symbol 402, which may negatively impact the performance of the transmitter 52 (e.g., may cause distortion on the low power symbol 402). To reduce or eliminate such undesirable outcomes, a compensation signal may be employed to counteract the gain drift 416.

Figure 5:
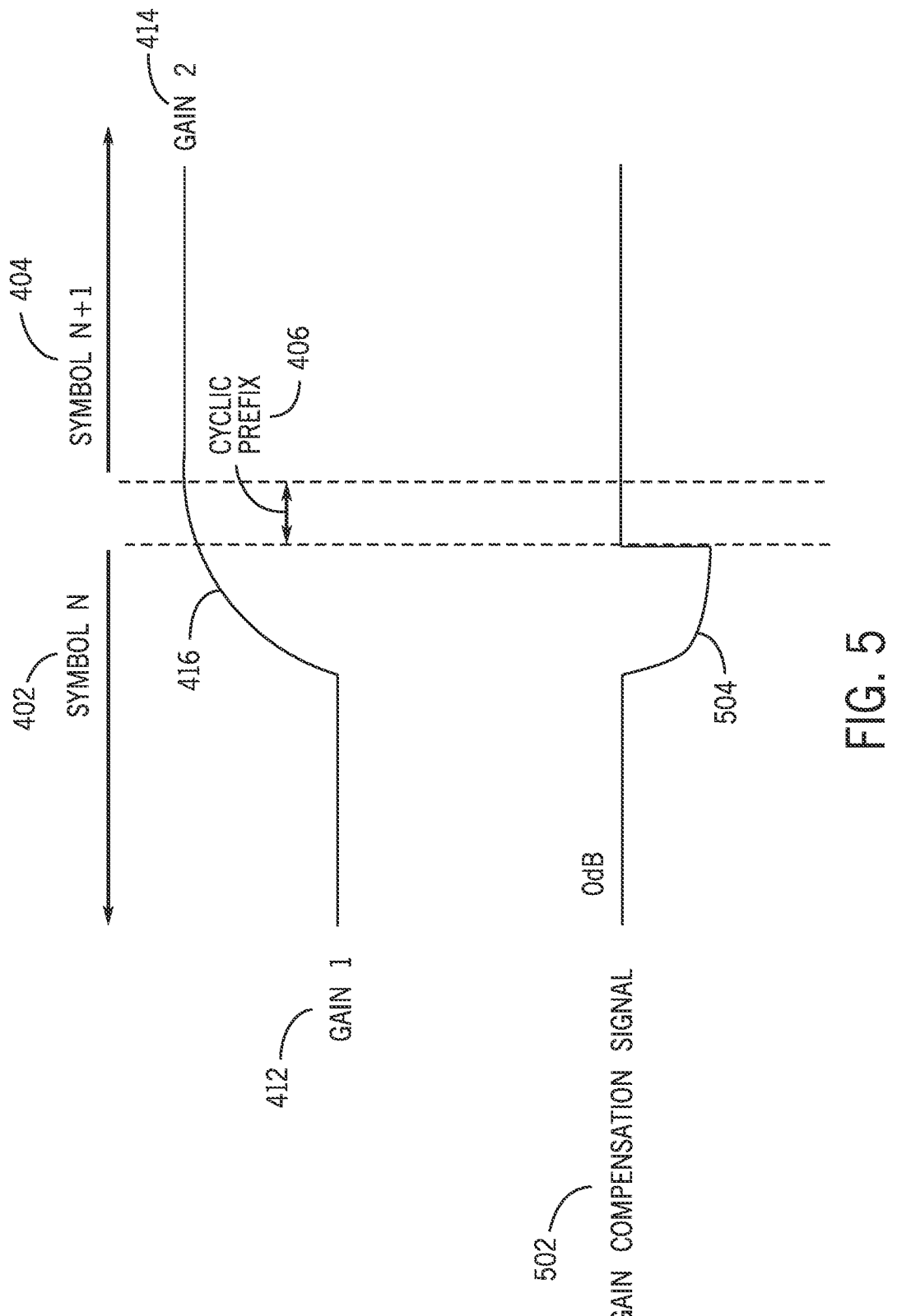
FIG. 5 is a timing diagram illustrating a compensation signal that may be applied to a transmitted signal to counteract a gain drift in a low power symbol, according to embodiments of the present disclosure.

FIG. 5 is a diagram illustrating a compensation signal 502 that may be applied to a transmitted signal to counteract the gain drift 416 in the low power symbol 402, according to embodiments of the present disclosure. As may be observed, the compensation signal 502 includes a compensation ramp 504. The compensation ramp 504 may have a shape identical or similar to the gain drift 416 (e.g., based on the ramp time and amplitude of the gain drift 416), but with a power output less than 0 decibels (dB) (e.g., a negative power). In some cases, the compensation signal 502 may be generated by adjusting (e.g., reducing) the voltage of the transmit signal. When the compensation signal 502 is applied to the low power symbol 402 of the transmit signal, the compensation signal 502 may compensate for the gain drift 416 (e.g., such that combining the low power symbol 402 with the gain compensation signal 502 may result in zero change to the low power symbol gain and eliminate the gain drift 416).

Figures 6, 7:
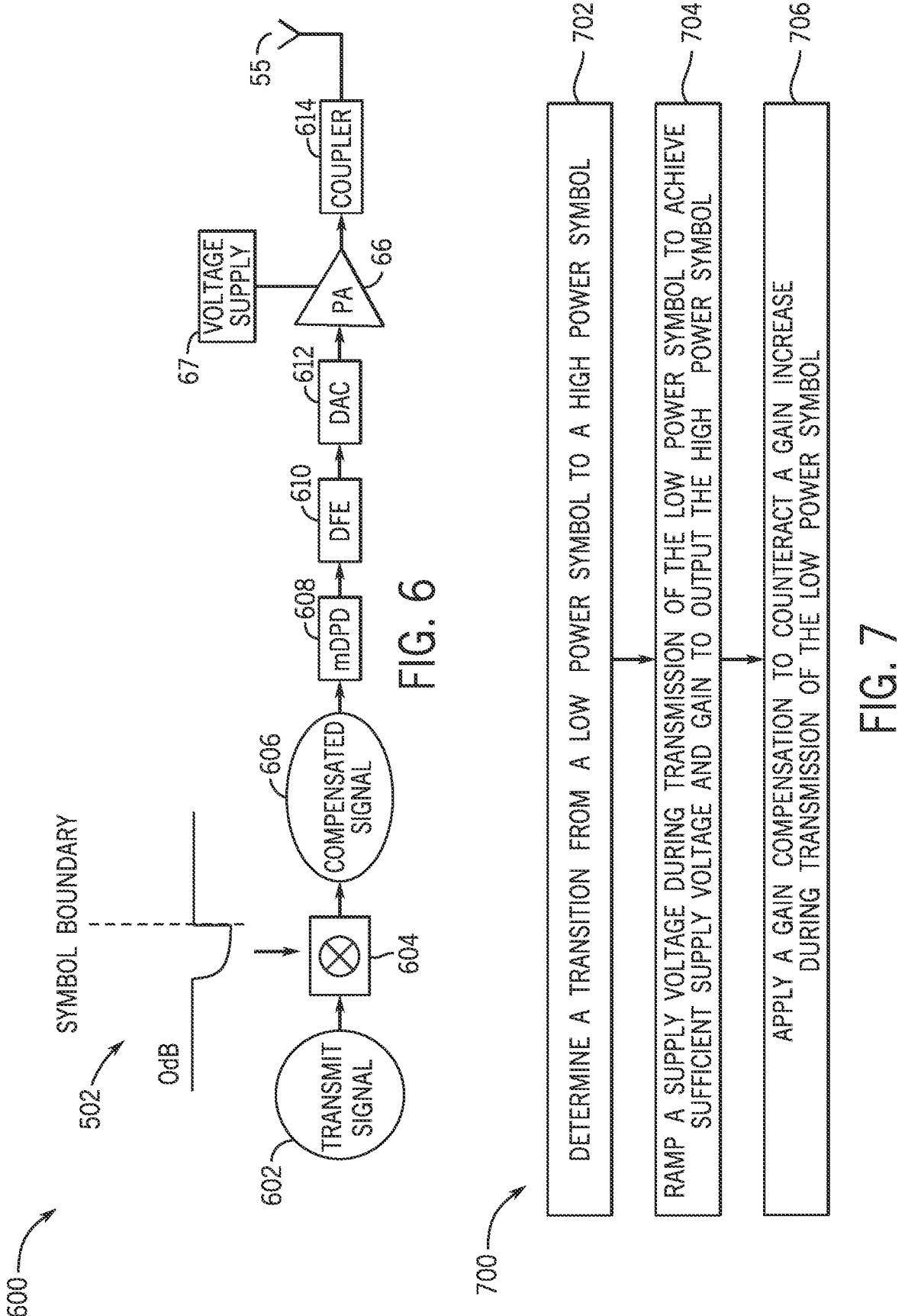
FIG. 6 a block diagram illustrating insertion of the compensation signal into a transmit chain of the transmitter of FIG. 3 to compensate for gain drift, according to embodiments of the present disclosure.
FIG. 7 is a flowchart of a method for transitioning from a low power symbol to a high power symbol and applying the compensation signal to mitigate or eliminate a gain increase during transmission of the low power symbol, according to embodiments of the present disclosure.

FIG. 6 is a block diagram illustrating insertion of the compensation signal 502 into a transmit chain 600 of the transmitter 52 to compensate for gain drift 416, according to embodiments of the present disclosure. A transmit signal 602 (e.g., the transmit signal to be output by the transmitter 52) and the compensation signal 502 may be inserted (e.g., via the processor 12) into a multiplier (e.g., a digital multiplier) or mixer 604 by, for example, the processor 12. The compensation signal 502 may adjust the transmit signal 602 to generate the compensated signal 606. The mixer 604 is coupled to a memory digital pre-distortion (mDPD) circuitry 608, which may perform linearization on the compensated signal 606 outputted from the mixer 604 (e.g., to improve linearity of the power amplifier 66). A digital front end (DFE) 610 is coupled to the mDPD circuitry 608. The DFE 610 may provide frequency conversion, channel filtering, and other functionality to the compensated signal 606. A digital-to-analog converter (DAC) 612 (e.g., a capacitive DAC) is coupled to the DI-E, 610. The DAC 612 may convert the compensated signal 606 to an analog signal. The power amplifier 66 may amplify the analog compensated signal 606, and output the amplified analog signal to a coupler 614 that may couple the power amplifier 66 to the antenna 55. The amplified analog signal may then be transmitted to another device via the antenna 55.

The compensation signal 502 may be determined (e.g., by the processor 12) based on a compensation profile of the gain drift 416. In an embodiment, the compensation profile may be calibrated or characterized based on a shape and amplitude of the gain drift 416 (e.g., determined during manufacture and stored in memory 14 and/or storage 16 of the electronic device 10).

FIG. 7 is a flowchart of a method 700 for transitioning from the low power symbol 402 to the high power symbol 404 and applying the compensation signal 502 to mitigate or eliminate the gain drift 416, according to embodiments of the present disclosure. Any suitable device (e.g., a controller) that may control components of the electronic device 10, such as the processor 12, may perform the method 700. In some embodiments, the method 700 may be implemented by executing instructions stored in a tangible, non-transitory, computer-readable medium, such as the memory 14 or storage 16, using the processor 12. For example, the method 700 may be performed at least in part by one or more software components, such as an operating system of the electronic device 10, one or more software applications of the electronic device 10, and the like. While the method 700 is described using steps in a specific sequence, it should be understood that the present disclosure contemplates that the described steps may be performed in different sequences than the sequence illustrated, and certain described steps may be skipped or not performed altogether.

In process block 702, the processor 12 determines a transition from the low power symbol 402 to the high power symbol 404. In process block 704, the processor 12 causes the power supply 67 to ramp up supply voltage to the power amplifier 66 during transmission and/or processing of the low power symbol 402 to enable the power amplifier 66 to increase from the low gain 412 to the high gain 414 by the end of the guard interval of the cyclic prefix 406. As discussed with respect to FIG. 4 and FIG. 5, ramping the supply voltage to the amplifier 66 may cause the gain drift 416 during the low power symbol 402. In process block 706, the processor 12 applies the gain compensation signal 502 to the mixer 604 (e.g., as illustrated in FIG. 6) to mitigate the gain drift 416 during transmission and/or processing of the low power symbol 402.

As previously mentioned, in some cases, there may be deviations (e.g., error due to temperature, age of the electronic device 10, loading conditions, and so on) between the stored compensation profile and the behavior of the power amplifier 66, such that the compensation signal 502 may undercompensate or overcompensate for the gain drift 416, resulting in residual positive or negative gain drift 416 present in the compensated signal 606, which may cause distortion on the signal output by the transmitter 52. Consequently, in some embodiments, one or more power control loops may be leveraged to dynamically adjust the compensation ramp 504 to enhance or optimize the compensation provided by the compensation signal 502 (e.g., by further reducing or eliminating the gain drift 416).

Figure 8:
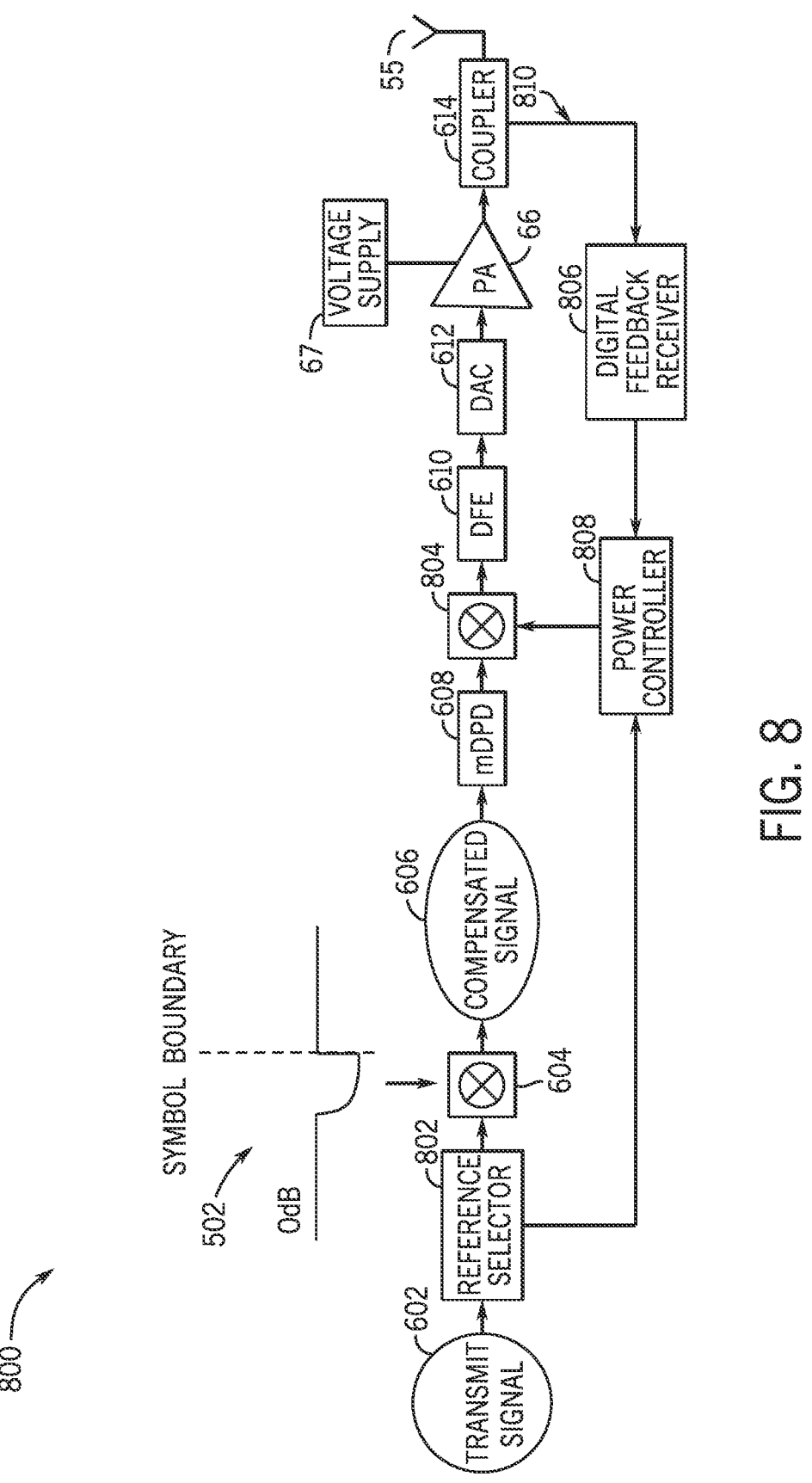
FIG. 8 is a block diagram of a transmit chain including a power controller in a feedback loop that dynamically adjusts compensation of the compensated signal to mitigate or eliminate residual gain drift that may occur during the low power symbol after applying an initial gain compensation, according to embodiments of the present disclosure.

FIG. 8 is a block diagram of a transmit chain 800 of the transmitter 52, the transmit chain 800 including a power controller 808 (e.g., an autonomous power controller (APC)) in a feedback loop 810 that dynamically adjusts the compensation (e.g., the compensation ramp 504) of the compensated signal 802 to mitigate or eliminate residual gain drift 416 that may occur during the low power symbol 402, according to embodiments of the present disclosure. The transmit chain 800 includes a reference selector 802 coupled to the multiplier (e.g., digital multiplier) or mixer 604. The reference selector 802 may store information regarding amplitude modulation of the transmit signal 602 that may be output to a power controller 808 to enable the power controller 808 to distinguish between what is gain drift 416 and what is part of the baseband signal. The feedback or power control loop 810 may include a feedback receiver 806 coupled to the coupler 614. The feedback receiver 806 may include analog-to-digital converter (ADC) circuitry and may convert an analog transmission signal output by the power amplifier 66 to a digital format. The feedback receiver 806 may also downconvert the digital signal to baseband. The feedback receiver 806 is coupled to the power controller 808, which may receive the downconverted digital compensated signal 606 from the feedback receiver 806. The power controller 808 may determine the gain drift 416 (e.g., residual gain drift) and cause the compensated signal 606 to be adjusted (e.g., further compensated) at a multiplier (e.g., digital multiplier) or mixer 804.

For example, if the power controller 808 determines that a residual gain drift of the compensated signal 606 is greater than an initial gain drift 416 of the compensated signal 606, the power controller 808 may increase (e.g., increase in the negative direction, decrease in the positive direction) the amplitude of the compensation ramp 504 of the compensation signal 502 during transmission of the low power symbol 402 to reduce the gain (e.g., reduce an instantaneous output amplitude) of the compensated signal 606. In another example, if the power controller 808 determines that the residual gain drift of the compensated signal 606 is less than an initial gain drift 416 of the compensated signal 606, the power controller 808 may decrease (e.g., decrease in the negative direction, increase in the positive direction) the amplitude of the compensation ramp 504 of the compensation signal 502 during transmission of the low power symbol 402, as the residual gain drift would be smaller than the gain drift 416, and reducing the amplitude of the compensation ramp 504 would prevent the power controller 808 from overcompensating for the residual gain drift.

FIG. 9 is a flowchart of a method 900 by which the power controller 808 may adjust the gain compensation to reduce residual gain drift (e.g., reduce an instantaneous output amplitude) in the transmit chain 800, according to embodiments of the disclosure. Any suitable device (e.g., a controller) that may control components of the electronic device 10, such as the processor 12, the feedback receiver 806, and/or the power controller 808, may perform the method 900. In some embodiments, the method 900 may be implemented by executing instructions stored in a tangible, non-transitory, computer-readable medium, such as the memory 14 or storage 16, using the processor 12. For example, the method 900 may be performed at least in part by one or more software components, such as an operating system of the electronic device 10, one or more software applications of the electronic device 10, and the like. While the method 900 is described using steps in a specific sequence, it should be understood that the present disclosure contemplates that the described steps may be performed in different sequences than the sequence illustrated, and certain described steps may be skipped or not performed altogether.

Process blocks 902, 904 and 906 are similar to the process blocks 702, 704, and 706 discussed with respect to FIG. 6. In process block 908, the power controller 808 samples the compensated signal 606 every N number of clock cycles (e.g., every clock cycle, every two clock cycles, and so on) per symbol to determine deviation (e.g., residual gain drift) between the low power symbol gain and a desired gain (e.g., a target gain of 0 dB) during transmission and/or processing of the low power symbol 402.

If, in query block 910, the power controller 808 determines that there is no deviation between the low power symbol gain and the desired gain, then the power controller 808 continues to sample the low power symbol gain as described in the process block 908. If, in query block 910, the power controller 808 determines there is a deviation between the low power symbol gain and the desired gain, then the power controller 808, in process block 912, adjusts the compensated signal 606 (e.g., adjusts a shape or amplitude of the compensation ramp 504 applied in process block 906) on a subsequent clock cycle of the same symbol to reduce or eliminate the deviation (e.g., the residual gain drift). The power controller 808 may apply the adjusted compensation ramp 504 (e.g., by outputting the adjusted compensation ramp 504 to the mixer 804) to mitigate or eliminate the low power symbol gain deviation (e.g., reduce an instantaneous output amplitude). For example, if the power controller 808 determines that a residual gain drift of the compensated signal 606 is greater than an initial gain drift 416 of the compensated signal 606, the power controller 808 may increase (e.g., increased in the negative direction, decreased in the positive direction) the amplitude of the compensation ramp 504 of the compensation signal 502 during transmission of the low power symbol 402 to reduce the gain (e.g., reduce an instantaneous output amplitude) of the compensated signal 606. In another example, if the power controller 808 determines that the residual gain drift of the compensated signal 606 is less than an initial gain drift 416 of the compensated signal 606, the power controller 808 may decrease (e.g., decrease in the negative direction, increase in the positive direction) the amplitude of the compensation ramp 504 of the compensation signal 502 during transmission of the low power symbol 402, as the residual gain drift would be smaller than the gain drift 416, and reducing the amplitude of the compensation ramp 504 would prevent the power controller 808 from overcompensating for the residual gain drift.

In some embodiments, if a low power symbol gain deviation is determined, the power controller 808 may determine whether the low symbol gain deviation exceeds a predetermined gain deviation threshold. If the power controller 808 determines that the low power symbol gain deviation does exceed the predetermined gain deviation threshold, the power controller 808 may adjust the compensated signal 606 (e.g., by causing a voltage adjustment at the mixer 804) to mitigate or eliminate the deviation. For example, if the power controller 808 determines that a residual gain drift of the compensated signal 606 is greater than an initial gain drift 416 of the compensated signal 606, the power controller 808 may increase (e.g., increased in the negative direction, decreased in the positive direction) the amplitude of the compensation ramp 504 of the compensation signal 502 during transmission of the low power symbol 402 to reduce the gain (e.g., reduce an instantaneous output amplitude) of the compensated signal 606. In another example, if the power controller 808 determines that the residual gain drift of the compensated signal 606 is less than an initial gain drift 416 of the compensated signal 606, the power controller 808 may decrease (e.g., decrease in the negative direction, increase in the positive direction) the amplitude of the compensation ramp 504 of the compensation signal 502 during transmission of the low power symbol 402, as the residual gain drift would be smaller than the gain drift 416, and reducing the amplitude of the compensation ramp 504 would prevent the power controller 808 from overcompensating for the residual gain drift.

If the power controller 808 determines that the deviation does not exceed the predetermined gain deviation threshold, the power controller 808 may refrain from adjusting the compensated signal 606, which may conserve processing power and reduce energy consumption in the transmitter 52. In some embodiments, the power controller 808 may determine gain deviation according to multiple gain deviation thresholds. For example, the power controller 808 may compare the gain deviation to a positive gain deviation threshold (e.g., if the gain provided by the power amplifier 66 during the low power symbol 402 is greater than a desired gain) and a negative gain deviation threshold (e.g., if the gain provided by the amplifier 66 during the low power symbol 402 is less than a desired gain). For example, if the power controller 808 determines that the gain deviation exceeds the positive gain deviation threshold, the power controller 808 may increase (e.g., increase in the negative direction, decrease in the positive direction) the amplitude of the compensation ramp 504 of the compensation signal 502 during transmission of the low power symbol 402 to reduce the gain deviation of the compensated signal 606. In another example, if the power controller 808 determines that the gain deviation falls beneath the negative gain deviation threshold (e.g., the initial compensation signal 502 resulted in an overcompensation), the power controller 808 may reverse the amplitude of the compensation ramp 504 of the compensation signal 502 during transmission of the low power symbol 402, such that the compensation signal 502 brings the gain of the compensated signal 606 above the negative gain deviation threshold.

In some embodiments, the positive gain deviation threshold and the negative gain deviation threshold may include different threshold limits depending on the power level of the symbol. For example, during transmission of the low power symbol 402, the positive gain deviation threshold may be more restrictive (e.g., the positive gain deviation threshold may be set at 2 dB to 4 dB above the desired gain), while the negative gain deviation threshold may be less restrictive (e.g., the negative gain deviation threshold may be set at 5 dB to 10 dB below the desired gain). However, during transmission of the high power symbol 404, the positive gain deviation threshold may be less restrictive (e.g., the positive gain deviation threshold may be set at 5 dB to 10 dB above the desired gain), while the negative gain deviation threshold may be more restrictive (e.g., the negative gain deviation threshold may be set at 2 dB to 4 dB below the desired gain).

Figure 10:
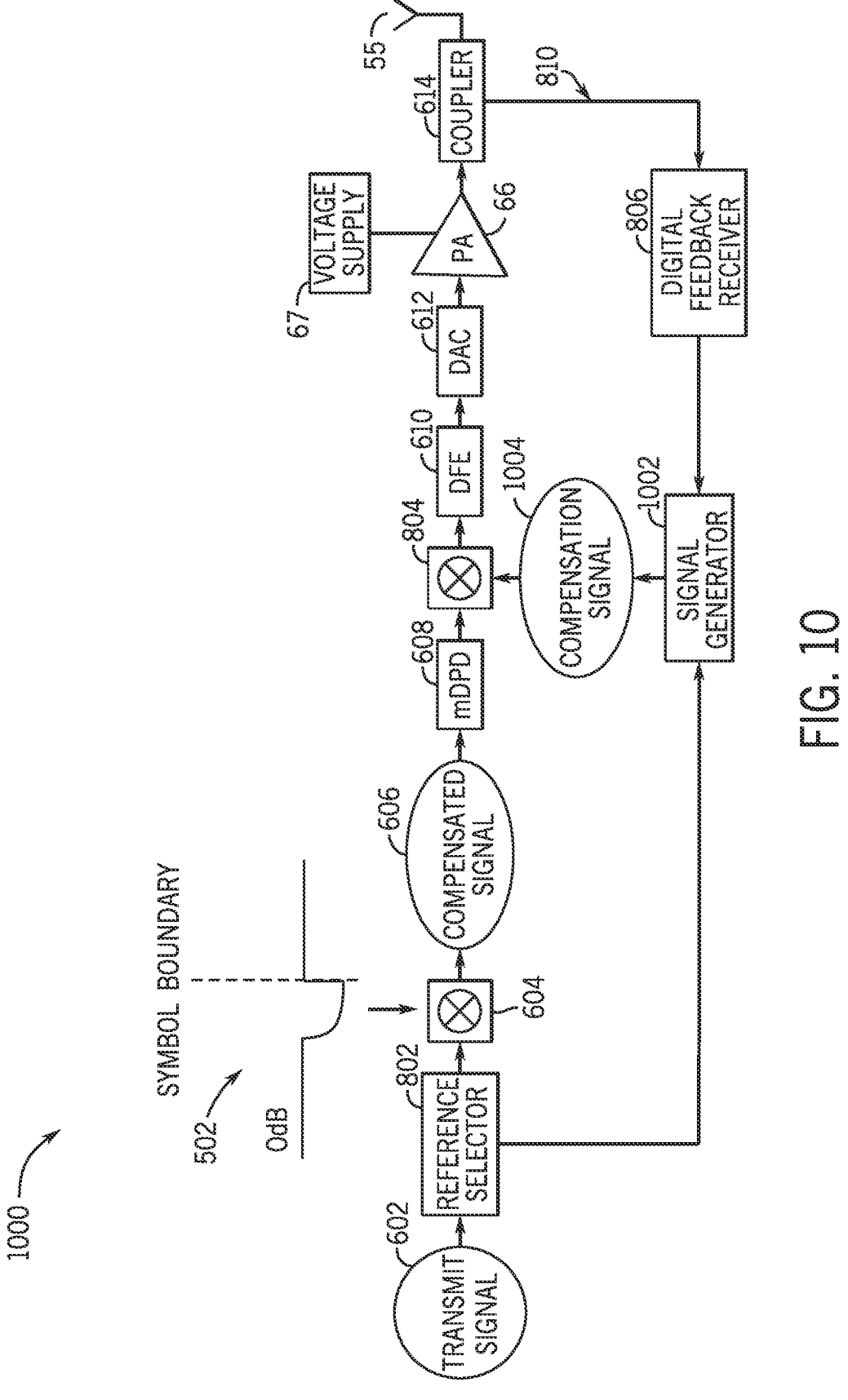
FIG. 10 is a block diagram of a transmit chain including a signal generator in a feedback loop that generates a compensation signal that adjusts a gain compensation of the compensated signal to mitigate or eliminate residual gain drift that may occur during the low power symbol, according to embodiments of the present disclosure.

In an additional or alternative embodiment, the transmitter 52 may include a signal generator that generates an additional compensation signal to correct for gain drift 416. FIG. 10 is a block diagram of a transmit chain 1000 including a signal generator 1002 in a feedback loop that may generate a compensation signal 1004 that adjusts the gain compensation of the compensated signal 606 to mitigate or eliminate residual gain drift that may occur during the low power symbol 402, according to embodiments of the present disclosure. The signal generator 1002 is coupled to the feedback receiver 806. The power controller 808 may determine the gain drift 416 based on the signal received from the feedback receiver 806. Based on the signal received from the feedback receiver 806, the signal generator 1002 may generate the compensation signal 1004 and output the compensation signal 1004 to the mixer 804 to adjust the transmit signal at a subsequent low power symbol 402, as will be described in greater detail below.

FIG. 11 is a flowchart of a method 1100 for generating a gain compensation signal to reduce residual gain drift in the transmit chain 1000, according to embodiments of the disclosure. Any suitable device (e.g., a controller) that may control components of the electronic device 10, such as the processor 12, the feedback receiver 806, and/or the signal generator 1002 may perform the method 1100. In some embodiments, the method 1100 may be implemented by executing instructions stored in a tangible, non-transitory, computer-readable medium, such as the memory 14 or storage 16, using the processor 12. For example, the method 1100 may be performed at least in part by one or more software components, such as an operating system of the electronic device 10, one or more software applications of the electronic device 10, and the like. While the method 1100 is described using steps in a specific sequence, it should be understood that the present disclosure contemplates that the described steps may be performed in different sequences than the sequence illustrated, and certain described steps may be skipped or not performed altogether.

Process blocks 1102, 1104 and 1106 are similar to the process blocks 702, 704, and 706 discussed with respect to FIGS. 7 and 902, 904, and 906 discussed with respect to FIG. 9. In process block 1108, the signal generator 1002 and/or the digital feedback receiver 806 checks the compensated signal 606 for a deviation between the gain provided by the power amplifier 66 during the low power symbol 402 and a desired gain (e.g., 0 dB) during the low power symbol 402. If, in query block 1110, the signal generator 1002 determines that there is no deviation (or, as discussed with respect to FIG. 8 and FIG. 9, if a deviation falls below a gain deviation threshold), then the signal generator 1002 and/or feedback receiver 806 may continue to check for a gain deviation as discussed with respect to process block 1108. If, in the query block 1110, the signal generator 1002 determines that there is a deviation (or, as discussed with respect to FIG. 8 and FIG. 9, if a deviation meets or exceeds a gain deviation threshold), then, in process block 1112, the signal generator 1002 determines a new compensation to mitigate the deviation, and generates an additional compensation (e.g., the compensation signal 1004) to apply the additional compensation to the compensated signal 606 of a subsequent symbol (e.g., by applying the compensation signal 1004 at the mixer 804) to compensate for the residual gain deviation associated with the subsequent symbol (e.g., a subsequent low power symbol 402).

For example, if in the query block 1110, the signal generator 1002 determines that the gain drift 416 of the compensated signal 606 meets or exceeds a positive gain deviation threshold, the signal generator may generate the compensation signal 1004 such that the amplitude of the compensation ramp 504 of the compensation signal 1004 is greater (e.g., has a greater negative amplitude) than the compensation ramp 504 of the compensation signal 502. The signal generator 1002 may apply the compensation signal 1004 to the mixer 804 at a subsequent symbol. In another example, if the signal generator 1002 determines that the gain drift 416 of the compensated signal 606 falls beneath a negative gain deviation threshold, the signal generator 1002 may generate the compensation signal 1004 such that the amplitude of the compensation ramp 504 of the compensation signal 1004 is less than (e.g., has a lesser negative amplitude) than the compensation ramp 504 of the compensation signal 502 (e.g., to prevent the signal generator 1002 from overcompensating at a subsequent symbol).

The compensation signal 1004 generated by the signal generator 1002 may include a linear compensation ramp, an exponential compensation ramp, or a combination thereof.

An initial amplitude of the compensation signal 1004 (e.g., to compensate for the gain drift 416) may be determined either via calibration or characterization (e.g., via the compensation mechanism discussed with respect to FIG. 6) at multiple biasing points. A normalized compensation ramp may be expressed by $$\mathrm{ramp}(t) = a\frac{t}{t_{ramp}} + b\left(1 - e^{-c\frac{t}{t_{ramp}}}\right),$$

which may be valid for a time t such that $0 \leq t \leq t_{ramp}$. The variables a and b in the preceding expression may be chosen such that after the time interval $t_{ramp}$ the value of the normalized ramp is equal to 1. Accordingly, b may be expressed by $$= \frac{1-a}{1-e^{-c}}.$$

The transmit chain 1000 may, according the expressions above, have two degrees of freedom—the variable a and the constant c. In some cases, the constant c may be fixed, leaving only a as an adjustable value. The feedback receiver 806 and the signal generator 1002 may, based on a gain deviation (e.g., the gain drift 416 or a residual gain drift) adjust the compensation signal 1004 based on a (e.g., by measuring the error vector magnitude of the compensated signal 606 received by the feedback receiver 806).

Figure 12:
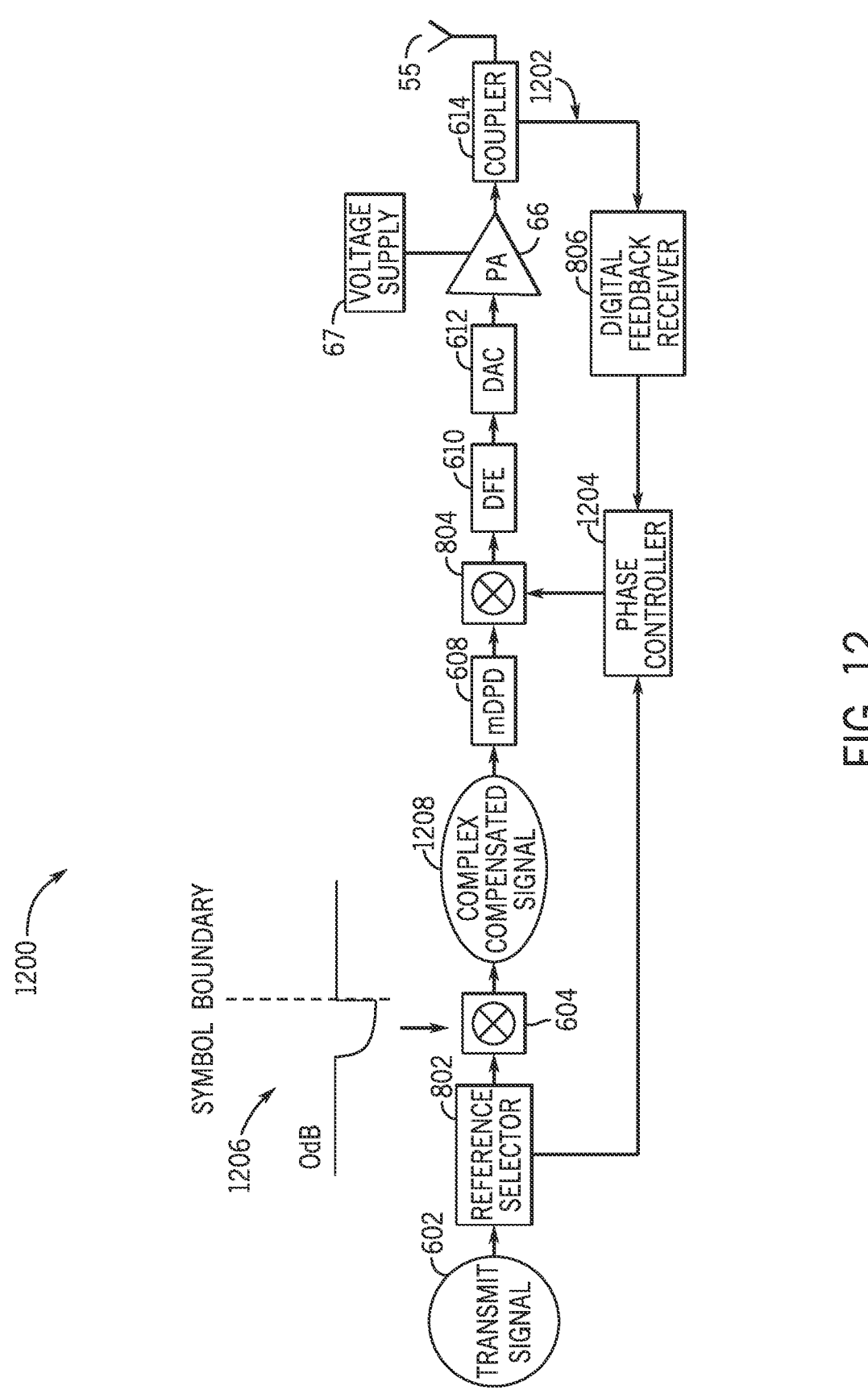
FIG. 12 is a block diagram of a transmit chain including a phase controller in a feedback loop that compensates for a phase error that may manifest in the transmit signal due to gain drift that may occur during a low power symbol, according to embodiments of the present disclosure.

In some cases, the gain drift 416 at the low power symbol 402 may introduce a phase error into the transmit signal 602. FIG. 12 is a block diagram of a transmit chain 1200 including a phase controller 1204 in a feedback loop 1202 that may compensate for a phase error that may manifest in the transmit signal 602 due to the gain drift 416 that may occur during the low power symbol 402, according to embodiments of the present disclosure. In contrast to the gain compensation signals previously discussed (e.g., 502 and 1004), the processor 12 may generate and apply a complex compensation signal 1206 rather than a scalar one. That is, the compensation signal 1206 may include a real compensation component to account for the amplitude error, and may include an imaginary compensation component to account for the phase error consequent to the gain drift 416. Accordingly, the compensated signal 1208 may be compensated with the real compensation component and the imaginary compensation component.

Similar to the transmit chains 800 and 1000, the transmit chain 1200 may include the feedback receiver 806 to perform digital-to-analog conversion and downconvert the digital signal to baseband. The phase controller 1204 may, based on the analog compensated signal 1208 received from the feedback receiver 806, determine a phase error in the compensated signal 1208 and apply a phase compensation. In the transmit chain 1200, the reference selector 802 may store information regarding a phase modulation of the transmit signal 602 that may be output to the phase controller 1204 to enable the phase controller 1204 to determine the phase error in an input signal received from the digital feedback receiver 806.

Figure 13:
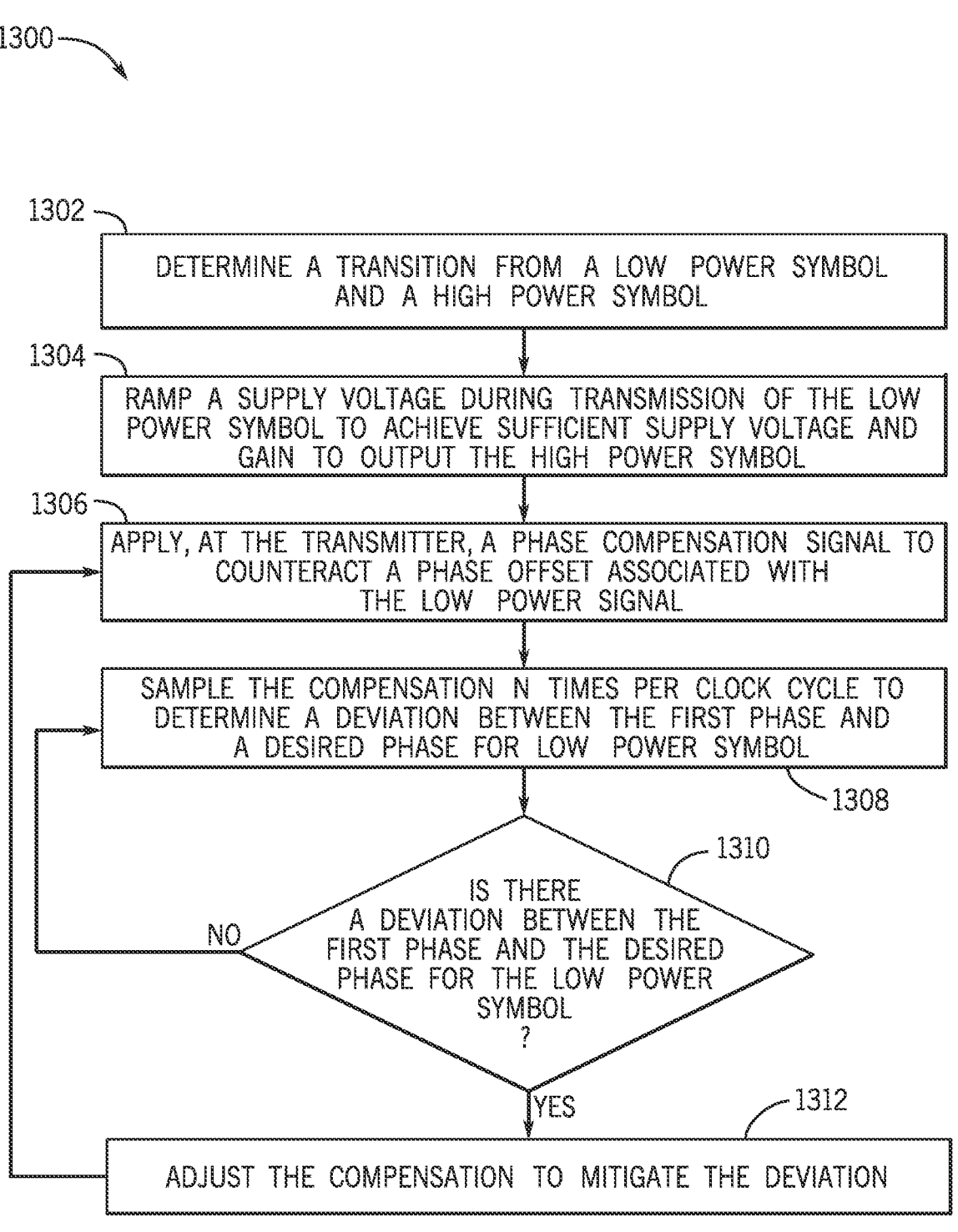
FIG. 13 is a flowchart of a method by which the phase controller of FIG. 12 may monitor and adjust a phase of a complex compensation signal to reduce phase error in the transmit chain of FIG. 12, according to embodiments of the disclosure.

FIG. 13 is a flowchart of a method 1300 by which the phase controller 1204 may monitor and adjust a phase of the complex compensation signal 1206 to reduce phase error in the transmit chain 1200, according to embodiments of the disclosure. Any suitable device (e.g., a controller) that may control components of the electronic device 10, such as the processor 12, the feedback receiver 806, and/or the signal generator 1300 may perform the method 1300. In some embodiments, the method 1300 may be implemented by executing instructions stored in a tangible, non-transitory, computer-readable medium, such as the memory 14 or storage 16, using the processor 12. For example, the method 1300 may be performed at least in part by one or more software components, such as an operating system of the electronic device 10, one or more software applications of the electronic device 10, and the like. While the method 1300 is described using steps in a specific sequence, it should be understood that the present disclosure contemplates that the described steps may be performed in different sequences than the sequence illustrated, and certain described steps may be skipped or not performed altogether.

In process block 1302, the processor 12 determines a transition from the low power symbol 402 to the high power symbol 404. In process block 1304, the processor 12 causes the power supply 67 to ramp up supply voltage to the power amplifier 66 during transmission and/or processing of the low power symbol 402 to enable the power amplifier 66 to increase from the low gain 412 to the high gain 414 by the end of the guard interval of the cyclic prefix 406. As previously discussed, ramping the supply voltage to the amplifier 66 may cause the gain drift 416 during the low power symbol 402. Ramping the supply voltage may also cause a phase error in the transmit signal 602 (e.g., at the power amplifier 66). In process block 1306, the processor 12 applies a phase compensation signal (e.g., the complex compensation signal 1206) to the digital multiplier (e.g., a complex digital multiplier or mixer) 604 to mitigate phase drift during transmission and/or processing of the low power symbol 402.

In process block 1308, the phase controller 1204 samples the compensated signal 1208 every N number of clock cycles (e.g., every clock cycle, every two clock cycles, and so on) per symbol to determine deviation between the phase of the low power symbol 402 and a desired phase of the low power symbol 402.

In query block 1310, if the phase controller 1204 determines that there is no phase deviation (or, similar to the gain thresholds discussed above, that the phase deviation falls beneath a phase deviation threshold), the phase controller 1203 may refrain from adjusting the complex compensation signal 1206 and may continue to sample the complex compensation signal 1206, as discussed with respect to the process block 1308. If the phase controller 1204 determines that there is a phase deviation (or, similar to the gain thresholds discussed above, that the phase deviation meets or exceeds a phase deviation threshold), the phase controller 1204 may adjust the complex compensation signal 1206 to mitigate or eliminate the phase deviation. The phase controller 1204 may apply the compensation to the compensated signal 1208 to output an adjusted complex compensation signal from the digital multiplier (e.g., a complex digital multiplier or mixer) 804 and continue to sample the adjusted complex compensation signal to determine if an undesirable amount of phase deviation is present in the compensated signal 1208. In this manner, the method 1300 may monitor and adjust the complex compensation signal 1206 to reduce phase error in the transmit chain 1200. It should be noted that the phase controller 1204 may be implemented along with the power controller 808 in the transmit chain 800 and/or along with the signal generator 1002 in the transmit chain 1000 to compensate for the gain drift 416.

For example, if the phase controller 1204 determines that a phase deviation of the compensated signal 1208 is greater than an initial phase deviation, the phase controller 1204 may increase the amplitude of the complex compensation signal 1206 during transmission of the low power symbol 402 to reduce the phase deviation of the complex compensation signal 1206. In another example, if the phase controller 1204 determines that the phase deviation of the compensated signal 1208 is less than an initial phase deviation, the phase controller 1204 may decrease the amplitude of the complex compensation signal 1206 during transmission of the low power symbol 402, as the phase deviation would be smaller than the initial phase deviation, and reducing the amplitude of the complex compensation signal 1206 would prevent the phase controller 1204 from over-compensating for the residual gain drift.

While the examples discussed and illustrated above refer to a transmit signal switching from a low power symbol (e.g., 402) to a high power symbol (e.g., 404), it should be noted that the disclosed embodiments may apply to any power transition (e.g., from the high power symbol 404 to the low power symbol 402) to compensate for gain drift, phase deviation, or both that may occur as a result of switching from the high power symbol 404 to the low power symbol 402. Alternatively, when switching from the high power symbol 404 to the low power symbol 402, the voltage supply 67 of the power amplifier 66 may be stepped down in small increments over consecutive symbols, which may prevent issues associated with a slow decay of the voltage.

In an embodiment, a transmitter includes a mixer that may output a compensated signal based on an input signal and a compensation signal that compensates for excess gain at a symbol of the input signal; a power amplifier electrically coupled to the mixer, where the power amplifier may amplify the compensated signal to generate an amplified signal; and a power controller electrically coupled to the power amplifier on a feedback path of the transmitter, where the power controller may adjust the compensation signal based on a deviation in gain of the compensated signal.

Where the transmitter includes a reference selector electrically coupled to the mixer and the power controller, where the reference selector may obtain amplitude modulation data regarding the input signal and output the amplitude modulation data to the power controller.

Where the power controller may sample the compensated signal N number of times within the symbol, and determine the deviation based on the N number of samples.

Where the power controller may adjust the compensation signal by adjusting a voltage level of the compensated signal.

Where the compensation signal is determined, via a processor, based on a compensation profile, the compensation profile based on a shape, an amplitude, or both of a gain ramp associated with the symbol of the input signal determined during a calibration.

Where the power amplifier may operate in an average power tracking mode.

The transmitter may include memory digital pre-distortion circuitry electrically coupled to the mixer, where the memory digital pre-distortion circuitry may perform linearization on the compensated signal.

The transmitter may include a digital front end electrically coupled to the mixer, where the digital front end may perform frequency conversion, channel filtering, or both on the compensated signal.

The transmitter may include a digital-to-analog converter (DAC) electrically coupled to the digital front end and the power amplifier, where the DAC may convert the input signal from a digital signal to an analog signal and pass the analog signal to the power amplifier.

Where the symbol includes a low power orthogonal frequency division multiplexing (OFDM) symbol.

In an embodiment, a method may include increasing a supply voltage of a power amplifier during transmission of a low power symbol of a transmit signal that is to transition to a high power symbol; applying a gain compensation to the transmit signal to reduce a gain associated with the low power symbol to generate a compensated signal; adjusting the gain compensation based on a deviation of the gain to generate an adjusted gain compensation; and applying the adjusted gain compensation to the compensated signal.

Where applying the adjusted gain compensation may include applying the adjusted gain compensation during a subsequent clock cycle of the low power symbol.

Where adjusting the gain compensation comprises adjusting a voltage of a gain compensation signal.

The method may include determining another deviation during a subsequent clock cycle of the low power symbol; and refraining from adjusting the gain compensation in response to determining that the other deviation falls beneath a gain deviation threshold.

The method may include applying the gain compensation to the transmit signal to reduce the gain associated with the low power symbol to a target gain of 0 decibels.

Where determining the gain of the compensated signal may include sampling the gain N number of times during the transmission of the low power symbol.

In an embodiment, a tangible, non-transitory, computer-readable medium may include machine-readable instruction, wherein the instruction may cause one or more processors of an electronic device to increase a supply voltage of a power amplifier during transmission of a low power symbol of a transmit signal that is to transition to a high power symbol; apply a gain compensation to reduce a gain associated with the low power symbol to generate a compensated signal; adjust the gain compensation based on a deviation of the gain to generate an adjusted gain compensation; and apply the adjusted gain compensation to the compensated signal.

The tangible, non-transitory, computer-readable medium may include the machine-readable instruction, wherein the instruction may cause the one or more processors of the electronic device to determine the deviation by sampling the gain N number of times during the transmission of the low power symbol.

Where causing the one or more processors to sample the gain N number of times during the transmission of the low power symbol may include causing the one or more processors to sample the gain every clock cycle of the low power symbol.

Where causing the one or more processors to adjust the gain compensation may include causing the one or more processors to adjust the gain compensation based on amplitude modulation data associated with the transmit signal.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ," it is intended that such elements are to be interpreted under 35 U.S.C. 112(f). However, for any claims containing elements designated in any other manner, it is intended that such elements are not to be interpreted under 35 U.S.C. 112(f).

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

What is claimed is:

1. A transmitter, comprising:
a first mixer configured to output a compensated signal based on an input signal and a first compensation signal;
a power amplifier electrically coupled to the first mixer, the power amplifier configured to amplify the compensated signal to generate an amplified signal;
a signal generator electrically coupled to the power amplifier on a feedback path of the transmitter, the signal generator configured to output a second compensation signal based on a deviation in gain of the compensated signal; and
a second mixer configured to apply the second compensation signal to the compensated signal.

2. The transmitter of claim 1, wherein the input signal comprises a signal that is to transition from a low power symbol to a high power symbol.

3. The transmitter of claim 2, wherein the signal generator is configured to output the second compensation signal to a subsequent low power symbol of the input signal, the second compensation signal configured to mitigate the deviation associated with the compensated signal.

4. The transmitter of claim 1, comprising a reference selector electrically coupled to the first mixer and the signal generator, the reference selector configured to obtain modulation data regarding the input signal and output the modulation data to the signal generator.

5. The transmitter of claim 4, wherein the modulation data comprises amplitude modulation data.

6. The transmitter of claim 1, wherein the first compensation signal is determined via a processor, the first compensation signal based on a compensation profile, the compensation profile based on a shape, an amplitude, or both of a gain ramp associated with a symbol of the input signal.

7. The transmitter of claim 1, comprising memory digital pre-distortion circuitry electrically coupled to the first mixer, the memory digital pre-distortion circuitry configured to perform linearization on the compensated signal.

8. The transmitter of claim 7, comprising a digital front end electrically coupled to the first mixer, the digital front end configured to perform frequency conversion, channel filtering, or both on the compensated signal.

9. The transmitter of claim 8, comprising a digital-to-analog converter (DAC) electrically coupled to the digital front end and the power amplifier, the DAC configured to convert the compensated signal from a digital signal to an analog signal and pass the analog signal to the power amplifier.

10. The transmitter of claim 1, wherein the input signal comprises a plurality of orthogonal frequency division multiplexing (OFDM) symbols.

11. A method, comprising:
increasing a supply voltage of a power amplifier during transmission of a low power symbol of a transmit signal that is to transition to a high power symbol;
applying a first gain compensation signal to the low power symbol of the transmit signal to reduce a gain associated with the low power symbol to generate a compensated transmit signal;
generating a second gain compensation signal based on a deviation of the gain; and
applying the second gain compensation signal to a subsequent symbol of the transmit signal.

12. The method of claim 11, wherein the gain associated with the low power symbol comprises an instantaneous output amplitude.

13. The method of claim 12, wherein the second gain compensation signal comprises a linear compensation ramp, an exponential compensation ramp, or a combination thereof.

14. The method of claim 11, comprising:
determining that another deviation of another subsequent symbol falls beneath a gain deviation threshold; and
refraining from generating another gain compensation.

15. The method of claim 11, wherein applying the first gain compensation signal to the low power symbol to reduce the gain comprises reducing the gain to a target gain of 0 decibels.

16. The method of claim 11, wherein the power amplifier is configured to operate in an average power tracking mode.

17. A tangible, non-transitory, computer-readable medium comprising machine-readable instructions, wherein the instructions are configured to cause one or more processors of an electronic device to:
increase a supply voltage of a power amplifier during transmission of a low power symbol of a transmit signal that is to transition to a high power symbol;
apply a first gain compensation signal reduce a gain associated with the low power symbol to generate a compensated signal;
generate a second gain compensation signal based on a deviation of the gain; and
apply the second gain compensation signal to the transmit signal during transmission of a subsequent low power symbol.

18. The tangible, non-transitory, computer-readable medium of claim 17, wherein the gain associated with the low power symbol comprises an instantaneous output amplitude.

19. The tangible, non-transitory, computer-readable medium of claim 17, wherein causing the one or more processors to generate the second gain compensation signal comprises generating the second gain compensation signal based on an amplitude modulation of the low power symbol.

20. The tangible, non-transitory, computer-readable medium of claim 17, wherein the low power symbol and the high power symbol each comprise an orthogonal frequency division multiplexing (OFDM) symbol.

* * * * *